United States Patent [19]
Wong et al.

[11] Patent Number: 5,522,932
[45] Date of Patent: Jun. 4, 1996

[54] CORROSION-RESISTANT APPARATUS

[75] Inventors: Manus K. Wong; Sandy M. Chew, both of San Jose, Calif.

[73] Assignee: Applied Materials, Inc., Santa Clara, Calif.

[21] Appl. No.: 62,979

[22] Filed: May 14, 1993

[51] Int. Cl.$^6$ .................................................. C23C 16/00
[52] U.S. Cl. ............................................................. 118/715
[58] Field of Search .................... 156/643; 118/723 E, 118/723 ER, 723 I, 723 IR, 723 R

[56] References Cited

U.S. PATENT DOCUMENTS

| | | | |
|---|---|---|---|
| 2,577,365 | 12/1951 | Reid | 205/264 |
| 3,578,943 | 5/1971 | Schoumaker | 219/121 |
| 3,708,418 | 1/1973 | Quinn | 204/298 |
| 3,717,504 | 2/1973 | Aonuma et al. | 428/670 |
| 3,729,396 | 4/1973 | Browning et al. | 205/264 |
| 3,767,369 | 10/1973 | Barlow et al. | 29/194 |
| 3,823,685 | 7/1974 | Koepp et al. | 118/49 |
| 3,902,978 | 9/1975 | Zilske et al. | 205/264 |
| 4,238,551 | 12/1980 | Lal et al. | 428/660 |
| 4,416,742 | 11/1983 | Kinase et al. | 205/264 |
| 4,486,513 | 12/1984 | Mashiko et al. | 428/670 |
| 4,910,041 | 3/1990 | Yanagihara et al. | 427/37 |
| 4,948,492 | 8/1990 | Neidrach et al. | 204/435 |
| 5,062,508 | 11/1991 | Ackermann et al. | 118/723 |
| 5,366,585 | 11/1994 | Robertson et al. | 156/643 |
| 5,433,832 | 7/1995 | Rich et al. | 204/164 |

FOREIGN PATENT DOCUMENTS

| | | | |
|---|---|---|---|
| 1922421 | 11/1970 | Germany | 205/264 |
| 49-25531 | 7/1974 | Japan | 205/264 |
| 856867 | 12/1960 | United Kingdom | 205/264 |
| 859806 | 1/1961 | United Kingdom | 205/264 |

OTHER PUBLICATIONS

Lowenheim, Frederick A., "Modern Electroplating", *The Electrochemical Society, Inc.*, New York, NY, 1942, pp. 312–314, 657.

Parker, Edward A., "Electrodeposition of Rhodium", *Plating*, Jul. 1955, pp. 882–892.

Schumpelt, K., "Electrodeposition of the Metals of the Platinum Group", *The Electrochemical Society*, Paper 80–40, Oct. 1941, pp. 449–558.

*Primary Examiner*—George Fourson
*Assistant Examiner*—Brian K. Dutton
*Attorney, Agent, or Firm*—Ashok K. Janah; Michael B. Einschlag

[57] ABSTRACT

A metal structure, such as an apparatus used in plasma processing of substrates, is rendered resistant to corrosion by coating components exposed to the plasma with a coating of rhodium. The rhodium coating can be made by electroplating, and preferably has a thickness of at least about 10 microinches, and preferably from about 10 to about 100 microinches. A coating of nickel can be applied between the rhodium coating and the metal component.

31 Claims, 2 Drawing Sheets

CORROSION-RESISTANT APPARATUS

BACKGROUND

This invention relates to a corrosion-resistant apparatus for processing substrates in a plasma, and in particular, to the processing of semiconductor wafers.

An ionized gas or "plasma" is used in many types of manufacturing processes, including for example, in semiconductor manufacturing processes. For example, a plasma can be used for cleaning semiconductor processing chambers, as described in U.S. Pat. No. 5,201,990, to Chang, et al., which is incorporated herein by this reference. A plasma is also used in plasma-enhanced chemical vapor deposition (CVD) processes for depositing coatings onto substrates, as described in U.S. Pat. No. 5,093,150, to Somero, et al., and U.S. Pat. No. 4,969,415, to Bartha, et al., both of which are incorporated herein by this reference. Another example is the use of plasma in reactive ion-etching processes to etch through metallic layers on substrates, as for example, described in U.S. Pat. No. 4,190,488, to Winters, and in U.S. Pat. No. 4,468,285, to Bayman, both of which are incorporated herein by this reference.

Plasma processing is generally carried out in an enclosed metal processing chamber containing metallic components. The metal components are used for loading and positioning substrates into the chamber, and for controlling process gas flow into and out of the chamber. The components are generally fabricated from metals and alloys such as stainless steel, aluminum, "INCONEL", "HAYNES", and "HASTALLOY". These materials can corrode in a plasma environment, particularly when the plasma is generated from a reactive gas. For example, the fluorine ions of the plasma of nitrogen trifluoride (which is used to clean processing chambers), is highly corrosive and readily corrodes metal components.

Corrosion of the metal components limits the life of the processing apparatus, consequently increasing the down time of the apparatus, and the cost of processing the semiconductor substrates. Also, corroded components can flake and create contaminant particles in the processing chamber, which can deposit on the substrate. It is difficult to non-destructively detect such contamination during the initial stages of fabricating the integrated circuit. Thus, it is only in the final stages of the manufacturing process, when the fully processed semiconductor substrates are worth between $50,000 to $100,000 each, that the contaminant deposits are discovered, and the entire wafer must be scrapped.

Thus, there is a need for metal structures, such as plasma processing apparatus, that resist corrosion when exposed to corrosive plasma environments, and which have reduced production of particles resulting from corrosion.

SUMMARY

The present invention satisfies these needs by providing a metal structure having metallic components, such as an apparatus useful for plasma processing of substrates, that is rendered resistant to corrosion. The corrosion-resistant apparatus can comprises a plurality of metal components exposed to the plasma. The metal components can be also exposed to temperatures in excess of 400° C. At least one of the metal components has a corrosion-resistant coating comprising rhodium. The thickness of the corrosion-resistant coating is at least about 10 microinches, preferably from about 10 to about 100 microinches, more preferably from about 20 to about 60 microinches, and most preferably about 40 microinches. A coating of nickel, preferably from about 200 to about 600 microinches, and more preferably about 400 microinches, can be used between the corrosion-resistant coating and the metal component.

The corrosion-resistant apparatus typically comprises a processing chamber having therein processing components that comprise: (i) positioning components for positioning a substrate in the chamber, (ii) gas inlet components for introducing a process gas into the chamber, (iii) gas exhaust components for exhausting gases from the chamber, (iv) plasma generating components for generating a plasma from the process gas, and (v) metal fasteners for fastening the components to the chamber. At least one of the processing components in the chamber is made of metal and coated with the corrosion-resistant coating.

The apparatus is used to process substrates by introducing a process gas into the chamber, and generating a plasma from the process gas. The plasma can be used for cleaning contaminant deposits deposited on the chamber and substrate, for etching a substrate such as by reactive ion etching processes, or for forming deposits on a substrate such as by chemical vapor deposition processes.

DRAWINGS

These and other features, aspects, and advantages of the present invention will become better understood with reference to the following description, appended claims, and accompanying drawings where:

DESCRIPTION

The present invention provides a corrosion-resistant metal structure having metal components, such as a plasma processing apparatus that resists corrosion by plasma, and which resists creation of contaminant particles in a plasma environment. The plasma corrosion resistance is achieved by coating the components exposed to the plasma with a coating comprising rhodium.

Apparatus

Figure 1:
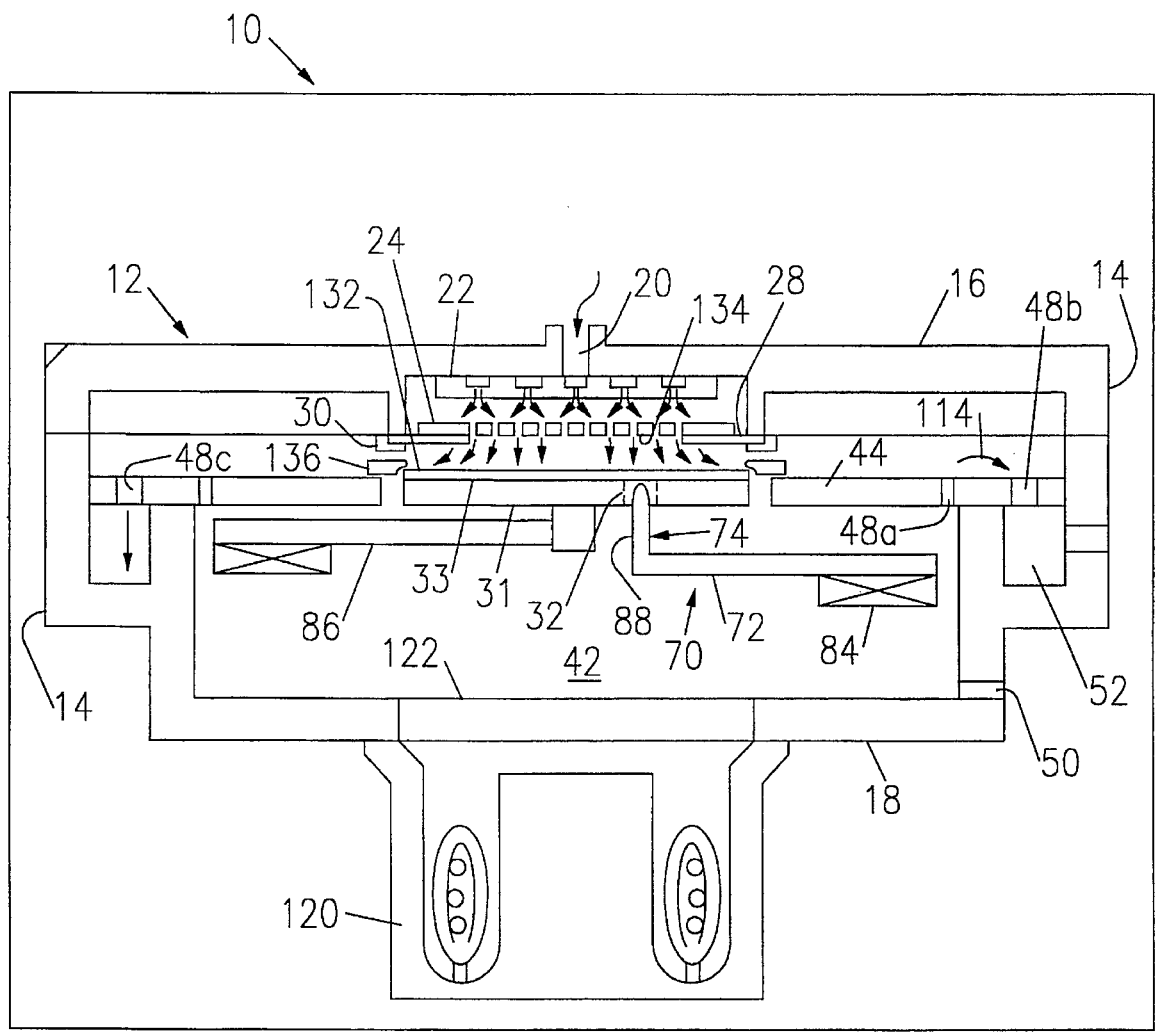
FIG. 1 is a schematic view, in partial vertical cross-section, of an apparatus according to the present invention suitable for plasma processing of a semiconductor wafer.

A schematic of an exemplary plasma processing apparatus 10 according to the present invention is shown in FIG. 1. The apparatus 10 comprises a plasma processing chamber 12 having sidewalls 14, a top wall 16, and a bottom wall 18. Process gas (from which a plasma is generated) is introduced into the chamber 12 through the inlet Thereafter, the gas passes through a perforated blocker plate 22 and a "showerhead" diffuser 24, both of which distribute the process gas. The blocker plate 22 and the showerhead are fastened to the chamber top wall 16 by fasteners such as screws 26. A ceramic shield ring 28 is detachably clamped over the diffuser 24 and into the top wall 16 by rotably mounted clamps 30.

Within the chamber 12 is located a vertically moveable support plate 31 having a plurality of holes 32a, 32b therethrough. A thin, circular, and flat substrate 33, such as a silicon based semiconductor wafer, may be introduced into the chamber 12 through a wafer load inlet 34 in the side wall 14 of the chamber 12 to rest upon the support plate 31. The plate 31 can be lifted or lowered so that the gap between the substrate 33 and the showerhead 24 can be adjusted for optimal process efficacy. The support plate 31 has a mounting arm 35 extending thereof. The mounting arm 35 is fastened to a support lift bellows 36 by a bracket 37, a nut plate 38, and screw assemblies 39a, 39b, 39c. The support lift bellows 36 provides a mechanism for lifting and lowering the support plate 31.

The interior volume of the chamber 12 is divided into two regions, a region 40 and a region 42, above and below, respectively, a horizontal perforated barrier plate 44. The perforated plate 44 has exhaust holes 48a, 48b, 48c therethrough. The exhaust holes 48a, 48b, 48c are in fluid communication with vacuum manifolds 50 and 52, for withdrawing spent process gas and process gas byproducts from the regions 40 and 42 as shown by the arrow 114 in FIG. 1.

A wafer lift finger assembly 70 is used to lift and lower the substrate 33 onto the support plate 31. The lift finger assembly 70 comprises a C-shaped ceramic ring 72 bearing four ceramic lift fingers 74 which extend radially toward the center of the C-shaped ring. The lift fingers 74 are fastened to the C-shaped ring 72 by fasteners comprising lift finger clamps 76 which are screwed over the lift fingers 74 and into the C-shape ring 72, using headless set screws 78a, 78b a top screw assembly 80 and a bottom screw assembly 82. The C-shaped ring 72 is attached to a finger lift bellows 84 by a mount 86. The lift fingers 74 have prongs 88, which can extend through the holes 32 of the support plate 31, to contact the substrate 33. The lift bellows 84 lifts and lowers the lift finger assembly 70.

A heater module 120 is below the support plate 31, and underneath a quartz window 122. The heater module 120 provides the energy required to heat the substrate 33.

Coated Components

All the metal components in the chamber 12 that are exposed to plasma and show signs of corrosion are candidates for a rhodium coating 124. However, it is preferred to coat the components that are exposed to the plasma and to temperatures in excess of about 200° C. which are, generally, subject to more severe corrosion. The temperature within the chamber was measured using a thermocouple located in the support plate 31 and the temperature of the component estimated from this measured temperature.

Examples of metals that have been coated with the corrosion-resistant coating, include "HAYNES 242" "Al- 6061", "SS 304", "SS 316", and INCONEL Generally, it is not necessary to coat the ceramic components within the chamber, because these components are substantially more resistant to corrosion by plasma than metal components. For the same reasons, it is also generally not necessary to coat the anodized aluminum components, which are protected by a coating of anodized aluminum. However, it can be necessary to coat these components in certain plasma environments, such as for example when the plasma is formed from a process gas which is reactive to ceramic materials.

The components typically coated are described below in Table I.

TABLE I

| COMPONENT | REFERENCE NO. |
|---|---|
| Blocker Plate | 22 |
| Showerhead Diffuser | 24 |
| Screws | 26 |
| Rotably Mounted Clamps | 30 |
| Support Lift Bellows | 36 |
| Nut Plate | 38 |

TABLE I-continued

| COMPONENT | REFERENCE NO. |
|---|---|
| Screw Assembly | 39 |
| Lift Finger Clamp | 76 |
| Headless Screws | 78 |
| Bottom Screw Assembly | 82 |
| Wafer Lift Bellows | 84 |

Figure 3:
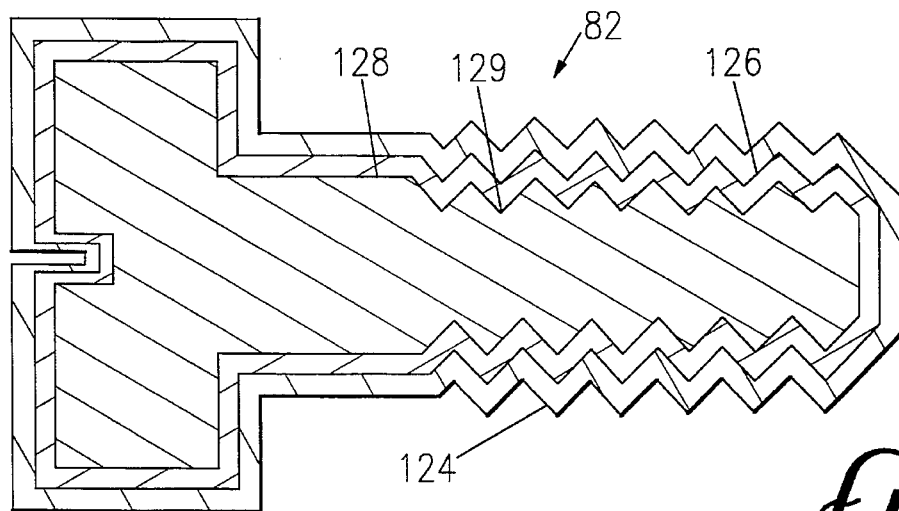
FIG. 3 is a side elevation sectional view of a coated component of the present invention.
Figure 2:
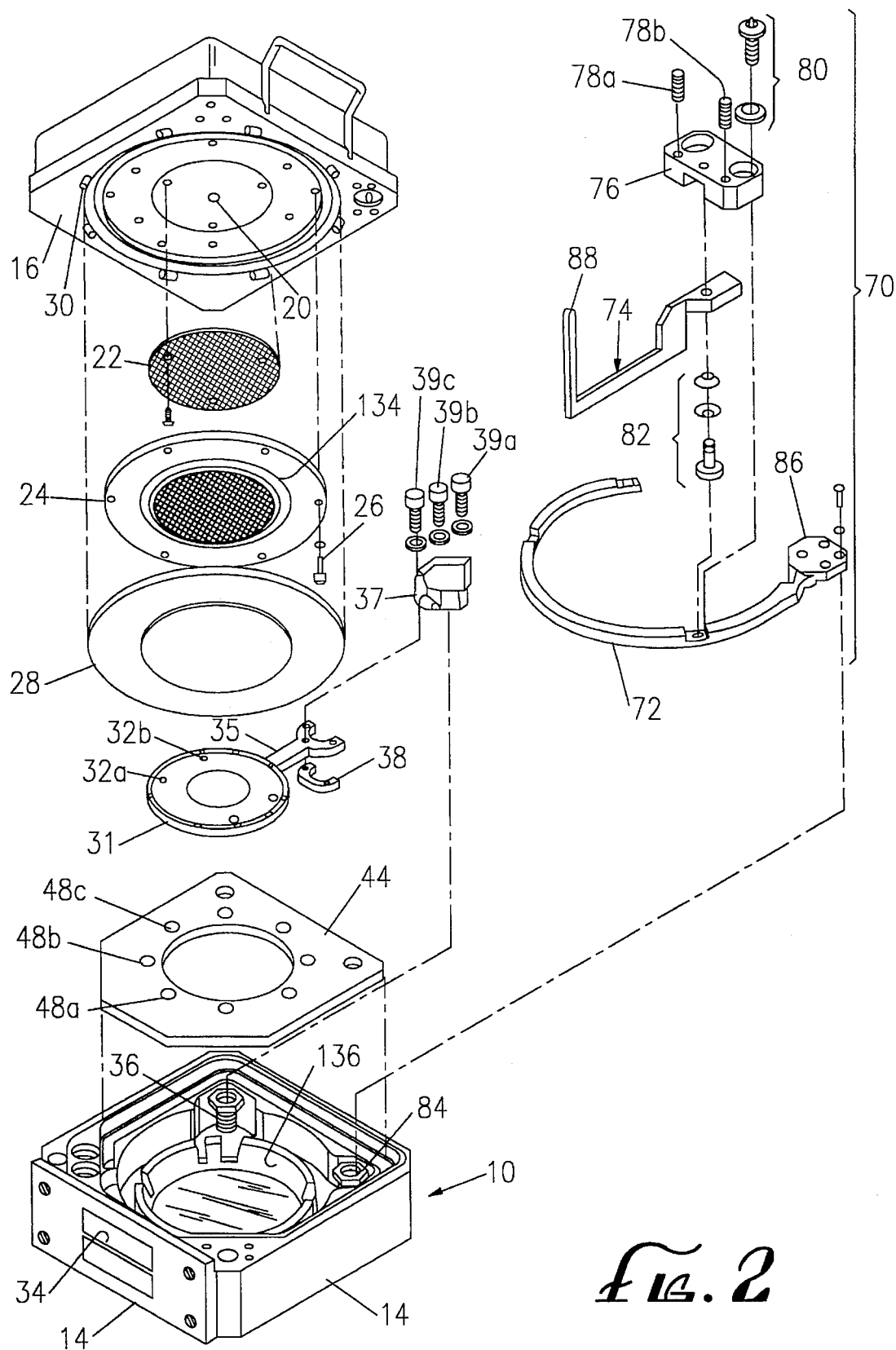
FIG. 2 is an exploded perspective view of the apparatus of FIG. 1, showing components within the apparatus.

With reference to FIG. 3, the coated screw 82 has a rhodium coating 124 thereon. The rhodium coating 124 has a thickness of at least about 10 microinches (i.e., $10 \times 10^{-6}$ inches or $2.54 \times 10^{-5}$ cms), preferably from about 10 to about 100 microinches ($2.54 \times 10^{-5}$ to $25.4 \times 10^{-5}$ cms), more preferably from about 20 to 60 microinches ($5.08 \times 10^{-5}$ to $15.24 \times 10^{-5}$ cms), and most preferably about 40 microinches ($10.16 \times 10^{-5}$ cms). More preferably, the corrosion-resistant coating has a coating of nickel 126 between the corrosion-resistant coating 124 and the surface 128 metal component The nickel layer 126 is sufficiently thick to allow the rhodium coating 124 to firmly adhere to the component 82. Preferably the thickness of the nickel coating 126 is from about 200 to about 600 microinches ($5.08 \times 10^{-4}$ to $15.24 \times 10^{-4}$ cms), and more preferably the nickel coating 126 has a thickness of about 400 microinches ($10.16 \times 10^{-4}$ cms).

The process used for coating the metal components with the rhodium 124, or the nickel 126 and rhodium 124 combination coating, can be any conventional coating processes, including for example, electroplating, sputtering, immersion coating or chemical vapor deposition.

Electroplating is a preferred method of coating the components. In the electroplating process, a electrolyte solution containing rhodium or nickel metal ions is subjected to a low voltage current between an anode and a cathode. The metal component to be coated is the cathode, and the anode can be made of a conductive material such as platinum, titanium-rhodium alloy, titanium-platinum alloy or stainless steel. Conventional electroplating processes and solutions are described in *Modern Electroplating*, edited by F. Lowenheim, 2d Ed., John Wiley & Sons (1963). Vendors used to electroplate the components of the present invention include ACTERON, of Redwood City, Calif., and HAMMON PLATING, of Palo Alto, Calif.

In order to ensure good adhesion of the electroplated coating to the metal components, the surface of the metal components must be thoroughly cleaned from oxide scale and/or grease, prior to electroplating. This cleaning can be carried out by agitating the metal component in a solution of dilute hydrochloric acid, or sulfuric acid, or in a degreasing solvent.

The rhodium electroplating can be carried out by immersing the metal component into an electrolyte solution containing from about 1 to about 100 grams/liter of a rhodium salt such as rhodium sulfate, rhodium sulfamate, and/or rhodium phosphate. The bath can also contain other additives for improving conductivity or for buffering the solution. For example, sulfuric acid can be added to improve the conductivity of the solution in quantities ranging from 1 to 100 ml/liter of solution. The exact pH and temperature of the bath may be adopted according to such conditions that are applicable for conventional electroplating.

The optional nickel plating can be carried out using a solution of nickel sulfate, nickel sulfamate, nickel chloride, or nickel fluroborate or combinations thereof. The solution can also include acids such as hydrofluoric acid, hydrochloric acid, or boric acid, and wetting agents, such as sodium lauryl sulphate or sodium lauryl ethyl sulfate.

A more uniform coating is obtained when the rhodium or nickel plating electroplating solution is agitated. The amount of agitation necessary depends on the complexity of the geometry of the component to be coated. Greater agitation is required to uniformly coat components with small features or crevices, such as the crevices 129 of the screw 82 or the perforations of the showerhead 24. Since the coating is provided to protect the component against corrosion, it is important to obtain a uniform and complete coverage of the metal component with the corrosion-resistent coating.

It is also important that the electroplating bath not be contaminated with other metal salts, which could cause deposition of contaminant metals on the components. These contaminant metals subsequently vaporize on exposure to high temperatures and deposit on the wafer, thereby contaminating the wafer and reducing the yield of the process.

EXAMPLES 1–3

Plasma Cleaning Process

The Cleaning Process

A chemical vapor deposition (CVD) process was used to deposit a coating onto a semiconductor substrate using the apparatus 10. After the CVD process, a plasma process was used to clean the chamber 12, the components within the chamber 12, and the substrate 33.

The plasma cleaning process was used to clean residual CVD deposits from the metal components, chamber walls, and from the backside of a semiconductor wafer. In order to clean the backside of the wafer 33, the prongs 88 of the lift fingers 74 are extended through the holes 32 of the support plate 31, to contact and lift the wafer 33 off the support plate 31 and until the front face 132 of the wafer 33 was pressed against the surface 134 of the showerhead diffuser plate 24.

A reactive "cleaning" gas such as nitrogen tri-fluoride ($NF_3$) was then introduced into the chamber, and a plasma generated from the gas, by positively charging the top wall 16, the blocker plate 22, and the showerhead 24, and by simultaneously grounding the barrier plate 44 and the chamber walls 136. The RF-generated plasma is maintained at a power level of about 10 to 1000 watts, for about 10 to about 80 seconds, and preferably from about 20 to about 40 seconds, for every wafer processed in the chamber. The plasma activated $NF_3$ reacts with the deposits on the backside of the wafer 33, chamber walls 136, and the metal components, to form gaseous compounds. The gaseous compounds are removed from the chamber, thereby substantially cleansing the chamber of deposits. Residual fluorine ions in the chamber are then passivated using a reactive hydrogen containing gas, such as hydrogen.

Example 1

A test was run comparing the corrosion performance of coated and uncoated components in a plasma environment. One of the screws 39 (made from "HAYNES 242" alloy) was left uncoated, and the other screws 39 as well as the bottom clamp 38 were coated with rhodium. The uncoated screws were cleaned with a 1:1 ratio $NH_4OH$:Hydrogen Peroxide solution prior to the plasma processing. After sequentially cleaning about 25 wafers by plasma, it was found that the uncoated screws 39 were corroded and discolored and the screws 39 coated with rhodium were not corroded.

Example 2

This experiment was run to determine if the corrosion-resistant rhodium coating vaporizes and contaminates wafers when exposed to high temperatures. A variety of rhodium plated components including small rectangular metal plates, "A1-6061" bushings, "INCONEL" washers, and "SS 304" lift finger components were placed on top of a silicon wafer and thermally cycled to 475° C. X-ray fluorescence was then used to determine if the areas of the silicon wafer in contact with the coated components were contaminated with rhodium. No rhodium was found in the contact areas of the silicon wafer, indicating that the rhodium plated coating did not vaporize at these temperatures.

Example 3

In this experiment, a rhodium coating 124 having a thickness of about 40 microinches was electroplated on top of an electroplated nickel coating 126 of thickness 400 microinches, on each of the following components: (i) the blocker plate 22, (ii) the showerhead diffuser 24, (iii) the screws 26, (iv) the rotably mounted clamps 30, (v) the support lift bellows 36, (vi) nut plate 38, (vii) the screw assemblies 39, (viii) the lift finger clamp 76, (ix) headless set screws 78, (x) the bottom screw assembly 82, and (xi) the wafer lift bellows 84. The components were then re-assembled in the apparatus 10.

The apparatus 10 was used to sequentially plasma clean about fifty wafers. After the processing, the components were visually examined for corrosion. There was little corrosion or discoloration on the rhodium coated parts. Also, the regions next to the blocker plate 22, showerhead diffuser 24, and the nut plate 38 did not show any residue or deposit. However, gray colored residue deposits were observed next to the support lift bellows 36, wafer lift bellows 84 and the lift finger clamps 74.

The present invention has been described in considerable detail with reference to certain preferred versions thereof, however, other versions are possible. For example, the present invention can be used for providing corrosion resistance for a metallic member of any metal structure. Furthermore, the present invention is not limited to use for semiconductor wafer processing. The invention can be used for any type of plasma processing apparatus. Therefore the spirit and scope of the appended claims should not be limited to the description of the preferred versions contained herein.

What is claimed is:

1. A corrosion-resistant apparatus for processing a substrate in a plasma, the apparatus comprising:
   (a) a plasma processing chamber; and
   (b) a plurality of metal components exposed to plasma in the plasma process chamber, wherein at least one metal component has a corrosion-resistant coating comprising:
      (i) a nickel coating on the metal component; and
      (ii) a rhodium coating on the nickel coating.

2. The apparatus of claim 1 wherein the thickness of the nickel coating is from about 200 to about 600 microinches.

3. The apparatus of claim 1 wherein the thickness of the rhodium coating is at least about 10 microinches.

4. The corrosion-resistant apparatus of claim 1, wherein the apparatus comprises at least one of the following components:
   (a) positioning components for positioning the substrate;

(b) gas inlet components for introducing process gas around the substrate;

(c) gas exhaust components for exhausting gases from around the substrate; and (d) plasma generating components for generating the plasma around the substrate.

5. A corrosion-resistant apparatus for processing a substrate in a plasma, the apparatus comprising:

(a) a plasma processing chamber; and (b) positioning components for positioning the substrate in the chamber, at least one of the positioning components being a component that is partially made of metal, exposed to the plasma in the chamber, and having a corrosion-resistant coating comprising rhodium.

6. The apparatus of claim 5 where the thickness of the corrosion-resistant coating is at least about 10 microinches.

7. The apparatus of claim 5 further comprising a nickel coating between the corrosion-resistant coating and the component that is partially made of metal.

8. The apparatus of claim 7 wherein the thickness of the nickel coating is from about 200 to about 600 microinches.

9. A corrosion-resistant apparatus for processing a substrate in a plasma, the apparatus comprising:

(a) a plasma processing chamber; and (b) gas inlet components for introducing a process gas into the chamber at least one of the gas inlet components being a component that is partially made of metal, exposed to the plasma in the chamber, and having a corrosion-resistant coating comprising rhodium.

10. The apparatus of claim 9 where the thickness of the corrosion-resistant coating is at least about 10 microinches.

11. The apparatus of claim 9 further comprising a nickel coating between the corrosion-resistant coating and the component that is partially made of metal.

12. The apparatus of claim 11 wherein the thickness of the nickel coating is from about 200 to about 600 microinches.

13. A corrosion-resistant apparatus for processing a substrate in a plasma, the apparatus comprising:

(a) a plasma processing chamber; and (b) gas exhaust components for exhausting gases from the chamber, at least one of the gas exhaust components being a component that is partially made of metal, exposed to the plasma in the chamber, and having a corrosion-resisitant coating comprising rhodium.

14. The apparatus of claim 13 where the thickness of the corrosion-resistant coating is at least about 10 microinches.

15. The apparatus of claim 13 further comprising a nickel coating between the corrosion-resistant coating and the component that is partially made of metal.

16. The apparatus of claim 15 wherein the thickness of the nickel coating is from about 200 to about 600 microinches.

17. A corrosion-resistant apparatus for processing a substrate in a plasma, the apparatus comprising:

(a) a plasma processing chamber; and (b) plasma generating components for generating a plasma in the chamber, at least one of the plasma generating components being a component that is partially made of metal, exposed to the plasma in the chamber, and having a corrosion-resistant coating comprising rhodium.

18. The apparatus of claim 17 wherein the thickness of the corrosion-resistant coating is at least about 10 microinches.

19. The apparatus of claim 17 further comprising a nickel coating between the corrosion-resistant coating and the component that is partially made of metal.

20. The apparatus of claim 19, wherein the thickness of the nickel coating is from about 200 to about 600 microinches.

21. A corrosion-resistant apparatus for processing a substrate in a plasma, the apparatus comprising a processing chamber and processing components comprising:

(a) positioning components for positioning the substrate in the chamber;

(b) gas inlet components for introducing a process gas into the chamber;

(c) gas exhaust components for exhausting gases from the chamber; and (d) plasma generating components for generating in the chamber the plasma from the process gas;

wherein at least one of the processing components is a component that is partially made of metal, is exposed to the plasma in the chamber, and has a corrosion-resistant coating comprising rhodium.

22. The apparatus of claim 21 further comprising metal fasteners for fastening the positioning components, the gas inlet components, and the gas exhaust components to the chamber, wherein at least one of the metal fasteners is exposed to the plasma and is coated with the corrosion-resistant coating.

23. The apparatus of claim 21, wherein the gas inlet components further comprises:

(a) a top plate having at least one process gas inlet hole therethrough for introducing process gas into the chamber;

(b) a plurality of perforated plates proximate to the gas inlet hole for distributing the process gas in the chamber; and (c) fasteners for fastening the perforated plates to the top plate, wherein the perforated plates and the fasteners are coated with the corrosion-resistant coating.

24. The apparatus of claim 21, wherein the positioning components comprise:

(a) a support plate, having a plurality of holes therethrough, and a mounting arm extending outwardly therefrom;

(b) support lift bellows fixedly attached to the support plate mounting arm by fasteners, for lifting and lowering the support plate; and (c) a lift finger assembly comprising:

(i) lift fingers having prongs, the prongs sized to fit into the support plate holes; and (ii) lift finger bellows attached to the lift fingers by fasteners, for lifting and lowering the lift fingers, so that the lift finger prongs when inserted through the support plate holes can lift and lower wafers onto the support plate, wherein the fasteners, the support lift bellows, and the lift finger bellows are coated with the corrosion-resistant coating.

25. The apparatus of claim 21 where the thickness of the corrosion-resistant coating is at least about 10 microinches.

26. The apparatus of claim 25 where the thickness of the corrosion-resistant coating is from about 10 to about 100 microinches.

27. The apparatus of claim 26 where the thickness of the corrosion-resistant coating is from about 20 to about 60 microinches.

28. The apparatus of claim 27 where the thickness of the corrosion-resistant coating is about 40 microinches.

29. The apparatus of claim 21 further comprising a nickel coating between the corrosion-resistant coating and the component that is partially made of metal.

30. The apparatus of claim 29 wherein the thickness of the nickel coating is from about 200 to about 600 microinches.

31. The apparatus of claim 29 wherein the thickness of the nickel coating is about 400 microinches.

* * * * *